United States Patent [19]

Abe et al.

[11] 4,311,546
[45] Jan. 19, 1982

[54] METHOD OF MANUFACTURING SEMICONDUCTOR DEVICE

[75] Inventors: Sigeharu Abe; Hideo Tamura, both of Aizuwakamatsu; Takayuki Murakami, Atsugi, all of Japan

[73] Assignee: Fujitsu Limited, Kawasaki, Japan

[21] Appl. No.: 166,170

[22] Filed: Jul. 7, 1980

[30] Foreign Application Priority Data

Jul. 11, 1979 [JP] Japan .................................. 54-87669

[51] Int. Cl.³ .................................... H01L 21/306
[52] U.S. Cl. .................................... 156/643; 156/645; 156/646; 156/657; 156/659.1; 156/662
[58] Field of Search ............... 156/643, 645, 646, 654, 156/655, 657, 659.1, 662; 252/79.1; 29/580; 427/271, 272, 277, 282

[56] References Cited

U.S. PATENT DOCUMENTS

| | | |
|---|---|---|
| 3,234,058 | 2/1966 | Marinace .......................... 148/175 |
| 3,506,506 | 4/1970 | Pennebaker .................. 156/659.1 X |
| 3,518,131 | 6/1970 | Glendinning ................ 156/659.1 X |
| 3,718,514 | 2/1973 | Erdman et al. ..................... 156/653 |
| 3,982,976 | 9/1976 | Marciniec ...................... 252/79.1 X |
| 3,990,925 | 11/1976 | Erdman et al. ........................ 156/3 |

*Primary Examiner*—William A. Powell
*Attorney, Agent, or Firm*—Daniel Jay Tick

[57] ABSTRACT

A method of surface treatment of a layer grown on a semiconductor substrate by chemical vapor deposition technique for removing a projection appearing on the layer comprises the steps of forming a layer on the semiconductor substrate by chemical vapor deposition technique, forming a membrane of plastic material that resists etching on the layer, pressing a flat plate against the plastic membrane on a projection of the layer to expose the projection, and etching the projection.

5 Claims, 4 Drawing Figures

FIG./ 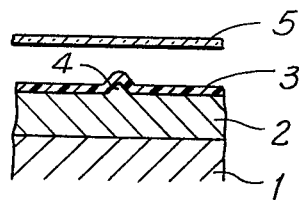

METHOD OF MANUFACTURING SEMICONDUCTOR DEVICE

BACKGROUND OF THE INVENTION:

The present invention relates to a method of manufacturing a semiconductor device. More particularly, the invention relates to a method of surface treatment of a layer grown on a semiconductor substrate by chemical vapor deposition technique.

The process of growing a layer by chemical vapor deposition technique, beginning with the formation of an epitaxial layer on the surface of a semiconductor substrate, is used extensively in the manufacture of semiconductor devices. The layer is hereinafter called a "vapor-phase-grown layer". An example of such process is the method of forming a silicon nitride membrane used in selectively forming a diffused region or oxidized layer. Another example of such process is the method of forming a polysilicon layer to be used as a conductive layer. Thus, the chemical vapor deposition technique has become an important and indispensable art.

However, unusual projections, that is, convex foreign matter, are often found on the surface of the vapor phase-grown layer on the surface of the semiconductor substrate. Where an epitaxial layer is grown on the silicon substrate, for example, it is generally observed that, due to the existence of heavy metals such as iron and copper or minute particles of silicon, abnormal projections commonly called "epitaxial rocks" appear where such metals or silicon particles are situated. The epitaxial rocks have an average height of several micrometers.

It is difficult to remove such epitaxial rocks even if conventional scrubbers are utilized. Where a semiconductor chip is formed on the vapor-phase-grown layer with such epitaxial rocks thereon, the surface of a photo-mask used in the photo process is damaged by scratches. If such a mask is used repeatedly, the product yield decreases exponentially as the scratches on the mask surface increase. Because of this, efforts have been made to maintain the desired product yield by limiting the frequency of use of a given photo-mask. This, in turn, necessitates an increase of the number of photo-masks to be kept in stock, and is reflected in a sharp rise of the manufacturing cost.

Furthermore, convex or projecting foreign matters also appear where a membrane of silicon nitride is formed. Such projections are difficult to remove. As experienced in the industry, the number of photo-masks in reserve is increased in order to avoid deterioration of the product yield. This raises the manufacturing cost in a like manner.

On the other hand, a method of using an alignment device with non-contact type mask has been proposed. However, since such a non-contact type device is expensive, the use of the device increases the manufacturing cost in a similar manner.

It is believed that there are three prior art publications of interest with respect to the invention.

U.S. Pat. No. 3,718,514, Erdman, discloses a method of removing projections from the surface of epitaxially-deposited semiconductor layers. In this method, a discontinuous film is applied to the oxide layer on the surface of epitaxial layers in such a manner that the discontinuities of the film align with the projections. Through a series of etching steps carried out thereafter, the projections are selectively removed. In carrying out such a method, however, a discontinous film must be prepared. If the film is used, there is no assurance that the discontinuities of the film are all aligned with the projections on the epitaxial layers.

Japanese Patent Publication (Unexamined) No. 121266 of 1976, published on Oct. 23, 1976, is for a Japanese patent application based on U.S. patent application Ser. No. 563,722, filed on Mar. 31, 1975, now U.S. Pat. No. 3,990,925. This publication also discloses a method for removal of projections on epitaxial layers. In this method, a membrane of inorganic dielectric material is formed on the surface of epitaxial layers on a substrate in such a manner that the thickness of the membrane is smaller than the average height of some projections on the epitaxial layers. A suitable tool such as, for example, a conventional razor blade, is then used to damage the projections. An etching process is then carried out to etch the projections selectively to finally remove said projections. This method involves a delicate operation of selectively damaging the projections, which means added human labor and added cost.

Japanese Patent Publication (Unexamined) No. 120272 of 1978, published on Oct. 20, 1978, discloses an invention for manufacturing semiconductor devices, more particularly a method of removing projections appearing on the surface of a semiconductor substrate. The method involves one type of evaporation that is termed an oblique evaporation. That is, masking material is evaporated at an angle of 10 degrees from the surface of the substrate. By this evaporation, only one side of the projection is covered by the masking material. Thereafter, etching is effected, the etching progressing from the side that is not covered by the masking material, and thus the projections are selectively removed.

Alternatively, masking material is evaporated perpendicularly to the surface of the substrate. The thickness of the material covering the projection is thinner than that of the material covering the remaining part of the substrate. By setting the etching time properly, the material covering the projection is completely etched, while some material still remains on the surface of the substrate. The projection is then etched without affecting the integrity of the remainder of the substrate surface.

The method disclosed in the cited publication involves evaporation performed obliquely, and it is apparent that a considerably complex device would be required to perform such an operation. Further, etching only the masking material on the projection, without affecting the surface of the substrate, would also be difficult. The projections are not all of the same size and the extent of etching necessary to carry out the disclosed method is indeterminate. To carry out the etching to selectively remove the projections would be extremely delicate and complex, and such a process would involve an additional device and an operation requiring extra cost.

Accordingly, the novel features of the method of the invention do not appear in the aforedescribed methods of the prior art.

Accordingly, a general object of the invention is to solve the problems encountered in the methods of the prior art by making the surface of a vapor-phase-grown layer flat and smooth.

More particularly, it is an object of the invention to remove projections or epitaxial rocks by the use of a flat glass plate or a suitable flat plate to rupture those parts of a membrane of plastic material covering the projections, and after removal of the membrane on the projections ruptured by contact with the flat plate, the projections are selectively etched and removed.

BRIEF SUMMARY OF THE INVENTION

In the present invention, the steps of the novel method for the removal of projections on a vapor-phase-grown layer comprise forming a membrane of plastic material that resists etching on the surface of the vapor-phase-grown layer, rupturing and removing the plastic membrane covering foreign matter or projections on the vapor-phase-grown layer by pressing a plate having parallel surfaces against the membrane to expose such projections, and, finally, selectively removing the projections by etching.

BRIEF DESCRIPTION OF THE DRAWINGS

In order that the invention may be readily carried into effect, it will now be described with reference to the accompanying drawings, wherein FIGS. 1 to 4 are schematic cross-sectional views showing how the method of the invention is carried out, in sequence.

DETAILED DESCRIPTION OF THE INVENTION

In carrying out the method of the present invention, photo-resist is applied by a conventional spinner on an epitaxial layer 2 deposited on a semiconductor substrate 1. After pre-baking the substrate thus worked on, a resist membrane 3 of the thickness of approximately 1 micrometer is formed, as illustrated in FIG. 1. The membrane 3 covers a convex projection or epitaxial rock 4 of some foreign matter or silicon particle appearing on the epitaxial layer 2.

Figure 2:
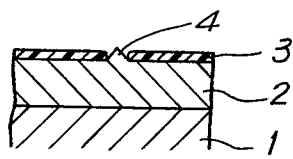

The semiconductor substrate 1 is next placed in position in a conventional contact type mask alignment device. A suitable glass plate 5 having a flat and smooth surface is pressed from above against the resist membrane 3 and then lifted. This pressing and lifting operation is carried out several times until the resist membrane covering the epitaxial rock 4 is ruptured, exposing the epitaxial rock 4, as seen in FIG. 2.

Figure 3:
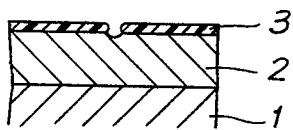

Then, the semiconductor 1, which has been worked as hereinbefore described, is baked in a known manner at about 100° C. and placed in a conventional plasma etching device to carry out plasma etching, using carbon tetrafluoride ($CF_4$) gas, until only the epitaxial rock 4 is etched and removed, as shown in FIG. 3.

Figure 4:
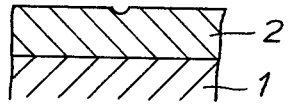

Thereafter, the resist membrane 3 is dissolved, using an organic solvent, and removed until the convex projection 4 of foreign matter vanishes from the epitaxial layer 2 to present an epitaxial layer having a flat and smooth surface, as shown in FIG. 4.

When the surface was treated as hereinbefore described, there were 3.2 defects per $cm^2$ on the surface of the epitaxial layer at points where epitaxial rocks were removed in accordance with the invention. This is compared to the average of 7.2 defects per $cm^2$ on the surface of the epitaxial layer at points where epitaxial rocks were removed by conventional technique. This indicates a substantial improvement of the surface condition. Convex projections of foreign matter appearing when a layer of silicon nitride is formed also consist essentially of a chemical compound of silicon, so that it is possible to remove such projections in the aforedescribed manner.

The disclosed embodiment involves a process wherein photo-resist is applied to the substrate, which then is set in a mask alignment device with a view to rupturing the resist membrane on the projection or epitaxial rock. The membrane for covering the epitaxial rock is not limited to a photo-resist, but may be any other membrane that can resist etching. The plate pressed against the resist membrane is not limited to a glass mask, but may be any other plate having a flat surface of high degree.

The etching is not limited to plasma etching, but the projections of foreign matter may likewise be removed by immersing them in an etching solution.

As hereinbefore described, in carrying out the method of the invention, additional steps are added to the conventional process. That is, plastic membrane is formed, mechanical contacts with the membrane are effected, and then the projections or epitaxial rocks of foreign matter are removed by etching. However, these additional steps can easily be performed in a known manner, and any increase in cost necessitated by these steps is amply compensated by the decreased number of required masks, which are expensive. Thus, the method of the invention reduces the cost of manufacturing the semiconductor devices.

Therefore, it will be appreciated that the method of the invention provides the results of raising the product yield and cutting down the manufacturing cost involved in the making of semiconductor devices.

The invention has been described in its best embodiment and mode of operation.

While the invention has been described by means of a specific example and in a specific embodiment, we do not wish to be limited thereto, for obvious modification will occur to those skilled in the art without departing from the spirit and scope of the invention.

We claim:
1. A method of manufacturing a semiconductor device, comprising the steps of
    forming a layer on a semiconductor substrate by chemical vapor deposition technique,
    forming a membrane of plastic material that resists etching on said layer,
    pressing a flat plate against said plastic membrane on a projection of said layer to expose only said projection, and
    etching said projection.
2. A method as claimed in claim 1, wherein said membrane on said layer is formed by photo-resist.
3. A method as claimed in claim 1, wherein said flat plate is glass.
4. A method as claimed in claim 1, wherein said projection is etched by plasma etching.
5. A method as claimed in claim 1, wherein said projection is etched by immersing said projection in an etching solution.

* * * * *